United States Patent
Garibin et al.

(10) Patent No.: US 6,736,893 B2
(45) Date of Patent: May 18, 2004

(54) PROCESS FOR GROWING CALCIUM FLUORIDE MONOCRYSTALS

(75) Inventors: Evgeny A. Garibin, St. Petersburg (RU); Aleksey A. Demidenko, St. Petersburg (RU); Boris I. Kvashnin, St. Petersburg (RU); Igor A. Mironov, St. Petersburg (RU); Gury T. Petrovsky, St. Petersburg (RU); Vladimir M. Reyterov, St. Petersburg (RU); Aleksandr N. Sinev, St. Petersburg (RU)

(73) Assignee: Corning Incorporated, Corning, NY (US)

( * ) Notice: Subject to any disclaimer, the term of this patent is extended or adjusted under 35 U.S.C. 154(b) by 63 days.

(21) Appl. No.: 10/124,542

(22) Filed: Apr. 16, 2002

(65) Prior Publication Data

US 2002/0185057 A1 Dec. 12, 2002

(30) Foreign Application Priority Data

Apr. 16, 2001 (RU) .......................................... 2001111056

(51) Int. Cl.$^7$ ............................ C30B 11/02; C30B 29/12
(52) U.S. Cl. ................................ 117/2; 117/81; 117/82; 117/83; 117/84; 117/942
(58) Field of Search ................................ 117/2, 81–84, 117/942

(56) References Cited

U.S. PATENT DOCUMENTS

| 4,030,965 | A | * | 6/1977 | Hammond et al. ......... 423/497 |
| 5,178,719 | A | * | 1/1993 | Pandelisev .................... 117/83 |
| 5,911,824 | A | | 6/1999 | Hammond et al. |
| 5,983,672 | A | | 11/1999 | Jinbo et al. |
| 6,201,634 | B1 | | 3/2001 | Sakuma et al. |
| 6,309,461 | B1 | * | 10/2001 | Gianoulakis et al. ........ 117/206 |
| 6,332,922 | B1 | * | 12/2001 | Sakuma et al. ................. 117/3 |
| 6,342,312 | B2 | * | 1/2002 | Oba et al. .................... 428/696 |
| 6,350,310 | B1 | * | 2/2002 | Gianoulakis .................... 117/2 |
| 6,375,551 | B1 | * | 4/2002 | Darcangelo et al. .......... 451/41 |
| 6,562,126 | B2 | * | 5/2003 | Price ............................. 117/81 |

* cited by examiner

Primary Examiner—Nadine G. Norton
Assistant Examiner—Matthew Anderson
(74) Attorney, Agent, or Firm—Walter M Douglas; Edward F Murphy

(57) ABSTRACT

The invention provides a process for growing UV region <200 nm transmitting calcium fluoride monocrystals, which includes crystallization from the melt, the annealing of the crystals and subsequent cooling, in a vacuum furnace, and which is effected by the continuous transfer of the crucible containing the melt from the crystallization zone into the annealing zone, each of these two zones having its own independent control system for the process parameters, characterized in that there is a temperature drop of 250–450° C. from the crystallization zone to the annealing zone, with a gradient of 8–12° C./cm, the crucible containing the material to be crystallized is moved from the crystallization zone to the annealing zone at a speed of 1–3 mm/hour, it is first kept in the annealing zone at a holding temperature of 1100–1300° C. for 20–40 hours and is then cooled first to 950–900° C. at a rate of 2–40° C./hour and then to 300° C. at a rage of 5–8° C./hour, after which the material is allowed to cool down naturally.

6 Claims, No Drawings

PROCESS FOR GROWING CALCIUM FLUORIDE MONOCRYSTALS

CROSS-REFERENCE TO RELATED APPLICATIONS

This application claims the benefit of priority under 35 U.S.C. §119 of Russian Federation Patent application Serial No. 2001111056.

This application is related to co-filed application, Ser. No. 10/124,546, which is hereby incorporated by reference.

BACKGROUND OF THE INVENTION

The present invention relates generally to optical fluoride crystals for transmitting below 200 nm UV region light, and particularly to UV region <200 nm transmitting calcium fluoride crystals for excimer laser lithography optics.

The present invention belongs to the technical field of preparing artificial crystals of optical-grade fluorite by growing its monocrystals from a melt, cooling them in a temperature gradient, and using a crystal nucleus for the growth.

Optical-grade fluorite crystals are grown industrially by Stockbarger's method, in which a crucible containing the melt is basically moved through a temperature domain with a gradient, under a high vacuum.

Two isothermal regions, with a temperature drop in between, are generally used when growing crystals in a downward moving crucible. This makes it possible to anneal the crystals straight after growing them, without subjecting them to the high thermal stresses that occur when there is an extremely great temperature drop. The furnace used here should have two temperature zones, with a minimal heat exchange between them. For this purpose, these zones are separated by a thermal insulator and a shielding screen, and the temperature in the two zones can be regulated independently from each other (see R. Lodiz* and R. Parker: "Rost kristallov" [Growth of Crystals], translated from English into Russian, edited by A. A. Chemov and published by Mir in Moscow in 1974, p. 181).

A process for growing calcium fluoride crystals has been described in the book entitled "Opticheskiy flyuorit" [Optical-Grade Fluorite] by N. P. Yushkin et al., published by Nauka in Moscow in 1983 (see pp. 83 and 84). This process includes the prior preparation, in which the apparatus and the crucible are first cleaned with compressed air, the crucible is filled with fluorite fragments, and the apparatus containing the crucible is put under a vacuum of $1\times10^{-4}$ mm Hg. The crucible is then heated to 1500° C. at a rate of 5° C./minute in the course of 4–5 hours. The material is kept at this holding temperature until it is completely melted and the melt is fully homogeneous, the time of which depends on the size of the crucible and can be up to 20 hours. The crucible containing the melt is then automatically lowered at a speed of 2–20 mm/hour.

The crystals are grown here in the crystallization zone at a constant crystallization temperature of 1450° C. for 10–15 hours, and the temperature of the furnace is then reduced to room temperature according tot a fixed temperature program. The total crystal-growing time is 30–50 hours. A single-stage annealing, carried out in the same crystal-growing apparatus, is recommended for optimal results. For the annealing of the crystals, the temperature in the upper zone of the furnace is reduced to a value of between 80 and 1150° C., depending on the size of the crystals. The crucible containing the crystals is then raised again to its initial position in the upper zone and kept there for 5–10 hours. The temperature is then reduced to 250–150° C. at a rate of 3–25° C./hour. The heating is finally stopped, and the crystals are allowed to cool down naturally over the rest of the temperature range.

However, the disadvantage of this process is that the crystal preparation is discontinuous, and the crystals have to be heated twice in the upper zone. This can lead to stresses in the resulting monocrystals and to the formation of blocks in them.

The process that is known from the prior art and which can be regarded as the one that is the most like the process according to the present invention is the crystal-growing method for calcium fluoride described in the first reference mentioned above, i.e. the book by R. Lodiz* and R. Parker: "Rost kristallov" [Growth of Crystals], translated from English into Russian, edited by A. A. Chemov and published by Mir in Moscow in 1974 (see p. 181 and p. 188 there).

In the process described in this book, the melt is cooled at a rate of at least 7° C./cm, and the crucible is made to descend at a speed of 1–5 mm/hour.

However, the details for the concrete realization of the crystal-growing procedure are not given in the description of any of the above processes.

Yet the process parameters must be carefully and specially chosen for all stages of the crystallization and the annealing if one is to obtain high-quality fluorite crystals that are suitable for the preparation of optical components with the required characteristics.

SUMMARY OF THE INVENTION

An aspect of the present invention is to prepare calcium fluoride monocrystals with a high optical uniformity (having a Δn value of $1\times10^{-6}$) and a low birefringence (having a δ value of 1–3 nm/cm).

An aspect of the invention is achieved by optimizing the conditions of the technological process involved in the entire cycle of growing monocrystals. The process involves crystallization from the melt and the annealing and cooling of the crystals, in a vacuum furnace. The crucible containing the melt is continuously moved from the crystallization zone into the annealing zone, and each of the two zones is fitted with its own independent means for controlling the process parameters. Unlike in the process according to the prior art, there is here a 250–450° C. temperature drop from the crystallization zone to the annealing zone, with a gradient of 8–12° C./cm. The crucible containing the material to be crystallized is moved from the crystallization zone to the annealing zone at a speed of 1–3 mm/hr. The material is first kept in the annealing zone at a holding temperature of 1100–1300° C. for 20–40 hours, and then it is cooled first to 950–900° C. at a rate of 2–4° C./hour, and then further to 300° C. at a rate of 5–8° C./hour, the rest of the cooling being allowed to occur naturally.

DETAILED DESCRIPTION OF THE PREFERRED EMBODIMENTS

The required set of process parameters is ensured by creating and maintaining the following temperatures: 1500±50° C. in the crystallization zone, 1100–1300° C. in the upper part of the annealing zone, and a value 20–50° C. less than the last one, in the lower part of the annealing zone.

With this combination, it is possible to ensure a control system for the regulation of the crystallization process—one that ensures favorable conditions for the growth of the crystals during the entire growing cycle.

The process according to the present invention makes it possible to obtain calcium fluoride monocrystals with a cylindrical shape, measuring up to 300 mm in diameter and up to 65 mm in height, and having the required optical characteristics.

In the preferred embodiment, the crystals are grown by the process according to the invention as described below. The charge, consisting of small fragments of fluorite crystals, is first introduced into a clean graphite crucible. The crucible is then placed in the crystal-growing apparatus, which is fitted with a set of heaters and heat-removing devices. The apparatus is divided into two zones—the crystallization zone and the annealing zone—which are separated from each other by a thermal insulator and a shield. The crucible is mounted on a crucible-moving rod, whose drive is governed by a programmed control system. The crystallization zone and the annealing zone are regulated separately. The whole apparatus is hermetically sealed, and then evacuated to a residual pressure of at least $5 \times 10^{-5}$ mm Hg. The temperature is then raised to the required values by regulating the electrical power supplied to the heaters. In the upper zone—the crystallization zone—the temperature is raised to 1500° C. and kept at this value for 30 hours. This ensures the complete melting of the charge, its homogenization and the removal of inclusions from it. The crucible containing the melt is then slowly lowered to the annealing zone at a speed of 1–3 mm/hour.

According to the invention, a temperature gradient of 8–12° C./cm is used between the crystallization zone and the annealing zone, which is achieved by the appropriate arrangement of the zones, i.e. by having a certain distance between them. This gradient guarantees the growth of a monocrystal on the nucleus without any peripheral block formation. The nucleus has the required crystallographic orientation and is placed at the bottom of the crucible.

It takes 270–350 hours to move the crucible from the crystallization zone to the annealing zone. When the crucible containing the melt has been lowered in to the annealing zone, the upper part of which is kept at a temperature of the order of 1200° C., the crucible is kept at this holding temperature for 30 hours in the case of crystals with a diameter of about 300 mm. The crystals are then cooled first to 900° C. at a controlled rate of 3° C./hour, and then to 300° C. at a controlled rate of 7° C./hour. The heating is finally switched off, and the whole apparatus is allowed to cool down naturally, which takes about 70 hours.

The whole crystal-growing process generally takes 650–700 hours.

The calcium fluoride crystals obtained by the process according to the invention have a high optical quality, a high optical uniformity [$\Delta n=(1-3)\times 10^{-6}$], a birefringence not exceeding 1–3 nm/cm, and a high optical transparency in the UV region.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

We claim:

1. Process for growing calcium fluoride monocrystals, which includes crystallization from the melt, the annealing of the crystals and subsequent cooling, in a vacuum furnace, and which is effected by the continuous transfer of the crucible containing the melt from the crystallization zone into the annealing zone, each of these two zones having its own independent control system for the process parameters, characterized in that there is a temperature drop of 250–450° C. from the crystallization zone to the annealing zone, with a gradient of 8–12° C./cm, the crucible containing the material to be crystallized is moved from the crystallization zone to the annealing zone at a speed of 1–3 mm/hour, it is first kept in the annealing zone at a holding temperature of 1100–1300° C. for 20–40 hours and is then cooled first to 950–900° C. at a rate of 2–4° C./hour and then to 300° C. at a rage of 5–8° C./hour, after which the material is allowed to cool down naturally.

2. Process according to claim 1, characterized in that the temperature in the crystallization zone is kept at 1500±50° C., that in the upper part of the annealing zone is kept at 1100–1300° C., while the temperature in the lower part of the annealing zone is kept at a value 20–50° C. less than that.

3. Method of making UV region <200 nm transmitting calcium fluoride crystals for excimer laser lithography optics, said method comprising:

providing a calcium fluoride melt contained in a growth crucible in a crystal growth annealing furnace having a crystallization zone and an annealing zone having independent process parameter control systems, crystallizing the melt into a calcium fluoride monocrystal, annealing the monocrystal and cooling the annealed monocrystal by continuous transfer of the crucible from the crystallization zone into the annealing zone with a temperature drop of about 250–450° C. from the crystallization zone to the annealing zone with a gradient of about 8–12° C./cm at a speed of about 1–3 mm/hour, with the monocrystal kept in the annealing zone at a holding temperature of about 1100–1300° C. for about 20–40 hours and then cooled first to about 950–900° C. at a rate of about 2–4° C./hour and then to 300° C. at a range of about 5–8° C./hour.

4. A method as claimed in claim 3 wherein the crystallization zone temperature is kept at 1500°±50° C. and the upper part of the annealing zone is kept at 1100–1300° C. while the lower part of the annealing zone is kept at a temperature value 20–50° C. less than the upper part 1100–1300° C. annealing zone temperature.

5. Method of making UV region <200 nm transmitting optical fluoride crystals for excimer laser lithography optics, said method comprising:

providing a optical fluoride melt contained in a growth crucible in a crystal growth annealing furnace having a crystallization zone and an annealing zone having independent process parameter control systems, crystallizing the melt into an optical fluoride monocrystal, annealing the monocrystal and cooling the annealed monocrystal by continuous transfer of the crucible from the crystallization zone into the annealing zone with a temperature drop of about 250–450° C. from the crystallization zone to the annealing zone with a gradient of about 8–12° C./cm at a speed of about 1–3 mm/hour, with the monocrystal kept in the annealing zone at a holding temperature of about 1100–1300° C. for about 20–40 hours and then cooled first to about 950–900° C. at a rate of about 2–4° C./hour and then to 300° C. at a range of about 5–8° C./hour.

6. A method as claimed in claim 3 wherein the crystallization zone temperature is kept at 1500°±50° C. and the upper part of the annealing zone is kept at 1100–1300° C. while the lower part of the annealing zone is kept at a temperature value 20–50° C. less than the upper part 1100–1300° C. annealing zone temperature.

\* \* \* \* \*